(12) United States Patent
Nguyen

(10) Patent No.: US 7,113,040 B2
(45) Date of Patent: Sep. 26, 2006

(54) DIFFERENTIAL AMPLIFIER

(75) Inventor: Nam Duc Nguyen, San Jose, CA (US)

(73) Assignee: Exar Corporation, Fremont, CA (US)

( * ) Notice: Subject to any disclaimer, the term of this patent is extended or adjusted under 35 U.S.C. 154(b) by 53 days.

(21) Appl. No.: 10/917,812

(22) Filed: Aug. 13, 2004

(65) Prior Publication Data

US 2006/0033570 A1   Feb. 16, 2006

(51) Int. Cl.
  *H03F 3/45*   (2006.01)
(52) U.S. Cl. .................. 330/253; 330/260; 327/359
(58) Field of Classification Search ............... None
  See application file for complete search history.

(56) References Cited

U.S. PATENT DOCUMENTS 5,045,804 A * 9/1991 Sugawara et al. .......... 330/295
5,858,425 A * 1/1999 Murayama ................ 426/89
6,373,317 B1 * 4/2002 Kostiainen et al. ......... 327/359

OTHER PUBLICATIONS

Hogervorst et al., "A Compact Power-Efficient 3 V CMOS Rail-to-Rail Input/Output Operational Amplifier for VLSI Cell Libraries," *IEEE Journal of Solid-State Circuits*, 29:12, Dec. 1994.

* cited by examiner

Primary Examiner—Khanh Van Nguyen
(74) Attorney, Agent, or Firm—Townsend and Townsend and Crew LLP

(57) ABSTRACT

The input stage of an operational amplifier includes at least four signal-receiving stages adapted to receive four input signals. If the voltage level associated with any of the input signal changes, at least one transistor in each of the at least four signal-receiving stages conducts more current and at least one transistor in each of these stages conducts less current. The four signal-receiving stages collectively generate four intermediate signals that are delivered to the output stage of the differential amplifier, which in response, generates a pair of differential output signals. Two of the input signals are derived from the pair of differential output signals and are fed back to the input stage of the amplifier.

16 Claims, 7 Drawing Sheets

DIFFERENTIAL AMPLIFIER

FIELD OF THE INVENTION

The present invention relates to operational amplifiers, and more particularly to operational amplifiers having multiple input stages.

BACKGROUND OF THE INVENTION

Operational amplifiers (op amp) are widely used in electronic circuits to amplify signals. An op amp is adapted to receive a pair of input signals and generates either a pair of differential output signals or a single-ended output signal. FIG. 1 is a schematic diagram of a conventional differential op amp 10 that receives a pair of differential input signals IN and IP—via resistors 18 and 16—and, in response, generates a pair of differential output signals OUTN and OUTP.

Op amp 10 has only two primary inputs, INN and INP; hence it must be connected in the inverting mode, therefore, as the voltage difference between applied input signals IN and IP, respectively, swings positively, the voltage difference generated across output signals OUTN and OUTP swings negatively. Similarly, as the voltage difference between applied input signals IN and IP, respectively, swings negatively, the voltage difference generated across output signals OUTN and OUTP swings positively. Signal CM is used as the common mode voltage level of op am 10. Resistors 12, 14 are feedback resistors, that together with resistors 16, 18, are used to vary the voltage gain of op amp 10. Signals Biasp1, Biasp2 and Biasn1 are used for biasing various transistors disposed in op amp 10.

FIG. 2 is a more detailed transistor/block schematic diagram of op amp 10 having a rail to rail input range (i.e., from most positive voltage supply to the most negative voltage supply). As seen from FIG. 2, op amp 10 includes an input stage 30 and an output stage 100, each of which is described in more detail below.

FIG. 3 is a transistor schematic diagram of input stage 30 of op amp 10. Input stage 30 includes a pair of source-coupled pair amplifiers, namely source-coupled pair amplifiers 40 and 45. Source-coupled pair amplifier 40 includes NMOS transistors 32 and 34. Source-coupled pair amplifier 45 includes PMOS transistors 36 and 38. Signal D generated at the drain terminal of NMOS transistor 32 is delivered to output terminal OUTP of op amp 10 via capacitor C10 (see FIG. 2). Signal C generated at the drain terminal of NMOS transistor 34 is delivered to output terminal OUTN of op amp 10 via capacitor C5. Signal A generated at the drain terminal of PMOS transistor 36 is delivered to output terminal OUTN of op amp 10 via capacitor C20. (see FIG. 2). Signal B generated at the drain terminal of PMOS transistor 38 is delivered to output terminal OUTP of op amp 10 via capacitor C 15.

FIG. 4 is a transistor schematic diagram of a class AB (push-pull) output stage 100 of op amp 10. Output stage 100 includes, in part, a common-mode feedback circuit 150, and a pair of floating current mirrors. The first floating current mirror includes transistors 102, 104, 106, 108, 110, 112, 126 and 128. The second floating current mirror includes transistors 114, 116, 118, 120, 122 and 124, 126, 128, 130 and 132. The operation of op amp 10 is described below.

Referring to FIGS. 2, 3 and 4, source-couple pair amplifiers 40 and 45 control the voltages applied to transistors 128, 132, 126 and 130, respectively via signals A, B, C, and D by steering the flow of the current through the first and second floating current mirrors. If the voltage applied to input terminal INP is higher than that applied to input terminal INN, transistors 32 and 36 become more conductive (i.e., conduct more current) whereas transistors 34 and 38 conduct less current. This, in turn, causes transistors 116 and 110 to conduct less current, and transistors 104 and 122 to conduct more current. Consequently, transistors 130 and 128 conduct more current whereas transistors 132 and 126 conduct less current. Accordingly, output voltage signal OUTP rises and output voltage signal OUTN falls until these voltages settle at new values because of the feedback action.

If the voltage applied to input terminal INN is higher than that applied to input terminal NP, transistors 32 and 36 conduct less current whereas transistors 34 and 38 conduct more current. This, in turn, causes transistors 116 and 110 to conduct more current, and transistors 104 and 122 to conduct less current. Consequently, transistors 130 and 128 conduct less current whereas transistors 132 and 126 conduct more current. Accordingly, output voltage signal OUTN rises and output voltage signal OUTP falls until these voltages settle at new values because of the feedback action.

FIG. 5 is a transistor schematic diagram of common-mode feedback circuit (hereinafter alternatively referred to as CMFB) 150. CMFB 150 receives signals OUTP, OUTN, BIASP1, and CM, as well as supply voltages VDD, VSS. In response, CMFB 150, generates output signal FB that is applied to the gate terminals of transistors 112, and 124 (see FIG. 4). CMFB 150 includes a source-coupled pair amplifier 170, a common-mode voltage sensor 160 and a pair of diode connected transistors 158, and 156. Common-mode voltage sensor 160 includes resistors 162, 164 and capacitors 166, 168. Source-coupled pair amplifier 170 which includes PMOS transistors 152 and 154 compares the voltage signal G generated by common-mode voltage sensor 160 and that is applied to the gate terminal of PMOS transistor 152 with signal CM, and in response, generates feed-back signal FB.

If signal G has a higher voltage than signal CM, transistor 152 becomes less conductive. Therefore, voltage signal FB decreases in value. Consequently, each of transistors 110, 112, 122, and 124 conducts less current. This causes the voltages of nodes N1, N2 (see FIG. 4), which are respectively connected to the drain terminals of transistors 110 and 122 to rise. The rise in the voltage at node N1 causes transistor 128 to conduct more current. Similarly, the rise in the voltage at node N2 causes transistor 132 to conduct more current. Accordingly, output voltages OUTP and OUTN fall until their common-mode voltage becomes substantially equal to the voltage CM.

Conversely, if signal G has a lower voltage than signal CM, transistor 152 becomes more conductive. Therefore, voltage signal FB increases in value. Consequently, each of transistors 110, 112, 122, and 124 conducts more current. This causes the voltages of nodes N1, N2 to decrease. The decrease in the voltage at node N1 causes transistor 128 to conduct less current. Similarly, the decrease in the voltage at node N2 causes transistor 132 to conduct less current. Accordingly, output voltages OUTP and OUTN rise until their common-mode voltage becomes substantially equal to the voltage CM.

As seen from FIG. 1, op amp 10 must be connected in the inverting mode. An amplifier (not shown) in a previous stage and driving this inverting mode amplifier is required to drive the resistive loads 18 and 16 associated with op amp 10. A simple CMOS source-follower amplifier would face difficulty in driving the resistive load associated with op amp 10 because the output impedance of such a CMOS source-follower amplifier is often much larger than the output impedance of the relevant bipolar transistors of the previous bipolar stage. This may cause the amplitude of output signals OUTP and OUTN to exceed the desired limits. Furthermore, op amp 10 has a limited bandwidth in the inverting mode comparing to the non-inverting mode.

FIG. 6 is a block diagram of a non-inverting differential amplifier 200, as known in the prior art, that overcomes some of the problems described above in connection with op amp 10. Differential amplifier 200 receives input signals IN, and IP and includes a first single-end output operational amplifier 210, and a second single-end output operational amplifier 220. Input signal IP is applied to input terminal INP of differential amplifier 220 and input signal IN is applied to input terminal INP of differential amplifier 210. Input terminal INN of differential amplifier 210 is coupled to a first terminal of resistor 214. Input terminal INN of differential amplifier 220 is coupled to a second terminal of resistor 214. Resistors 212 and 216 couple the first and second terminal of resistor 214 to the output terminals of differential amplifier 210 and 220. Because differential amplifier 200 includes two amplifiers, namely amplifier 210, and 220, it requires more semiconductor surface area to fabricate and also consumes more power to operate.

BRIEF SUMMARY OF THE INVENTION

The input stage of a differential amplifier, in accordance with the present invention, includes at least four signal receiving stages adapted to receive four primary input signals. If the voltage level associated with any of the input signal changes, at least one transistor in each of the at least four signal-receiving stages conducts more current and at least one transistor in each of these stages conducts less current. The four signal-receiving stages collectively generate four intermediate signals that are delivered to the output stage of the differential amplifier, which in response, generates a pair of differential output signals. Two of the input signals may be derived from the pair of differential output signals and are fed back to the input stage of the amplifier.

In some embodiments, each of the four signal-receiving stages includes a source-coupled pair amplifier, two of which are formed from a pair of NMOS transistors and two of which are formed from a pair of PMOS transistors. Each pair of NMOS transistors disposed in each source-coupled pair amplifier is coupled to a different current sink and each pair of PMOS transistors disposed in each source-coupled pair amplifier is coupled to a different current source. Each of the four input signals is applied to the gate terminal of an NMOS transistor of a source-coupled pair amplifier and the gate terminal of a PMOS transistor of a different source-coupled pair amplifier. The common-mode gain of the multi-input differential amplifier is varied using a signal applied to a common-mode circuitry disposed in the output stage of the amplifier.

In some embodiments, the differential amplifier is configured to provide non-inverting differential signal amplification. In these embodiments, three external resistors are used to set the gain of the differential amplifier and to feed the output signals of the differential amplifier back to the amplifier's input stage. The first one of these resistors is coupled between one of the output terminals and the input terminal receiving one of the feedback signals. The second one of these resistors is coupled between the other one of the output terminals and the input terminal receiving the other one of the feedback signals. The third one of these resistors is coupled between the input terminals receiving the feedback signals.

In some other embodiments, the differential amplifier is configured to provide inverting differential signal amplification using four external resistors adapted to set the gain of the differential amplifier and to feed the output signals of the amplifier back to the amplifier's input stage. The first one of these resistors is coupled between one of the output terminals and the input terminal receiving one of the feedback signals. The second one of these resistors is coupled between the other one of the output terminals and the input terminal receiving the other one of the feedback signals. The third one of these resistors has a first terminal that receives one of the differential input signals and a second terminal coupled to the input terminal receiving one of the feedback signals. The fourth one of these resistors has a first terminal that receives the other one of the differential input signals and a second terminal coupled to the input terminal receiving the other one of the feedback signals. The two other input terminals of the amplifier receive the common-mode signal.

In yet other embodiments, the differential amplifier is configured to provide inverting differential signal amplification using four external resistors adapted to set the gain of the amplifier and to feed the output signals of the amplifier back to the amplifier's input stage. The first one of these resistors couples the inverting output terminal to the non-inverting input terminal. The second one of these resistors couples the non-inverting output terminal to the inverting input terminal. The third one of these resistors has a first terminal that receives one of the differential input signals and a second terminal coupled to the non-inverting input terminal receiving one of the feedback signals. The fourth one of these resistors has a first terminal that receives the other one of the differential input signals and a second terminal coupled to the inverting input terminal receiving the other one of the feedback signals.

DETAILED DESCRIPTION OF THE INVENTION

Figure 7:
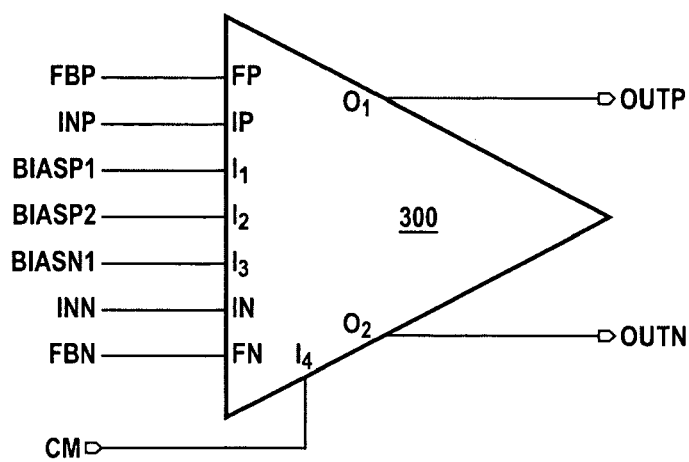
FIG. 7 is a simplified block diagram of a differential amplifier, in accordance with one embodiment of the present invention.

FIG. 7 is a block diagram of an operational amplifier 300, in accordance with one embodiment of the present invention. Operational amplifier (hereinafter alternatively referred to as op amp) 300 is adapted to receive, in part, four primary differential input signals, namely signals INP, INN, FBP and FBN, and to deliver differential output signals OUTP and OUTN. Op amp 300 is also adapted, in part, to receive biasing signals BIASP1, BIASP2 and BIASN1 that are used to bias various transistors disposed therein. Input signal CM is used to set the common mode level of operational op amp 300.

Figure 8:
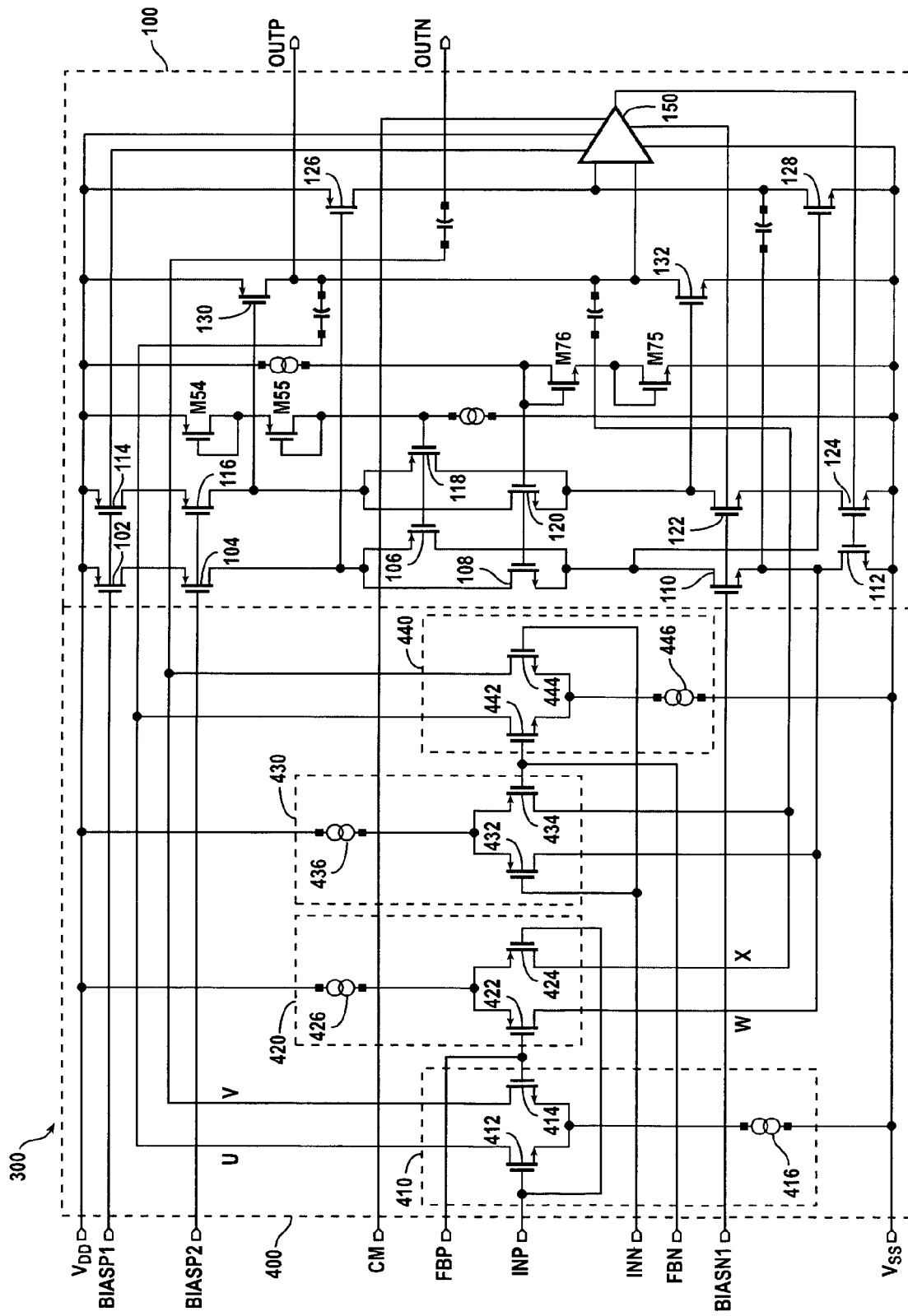
FIG. 8 is a more-detailed transistor/block diagram of input/output stages of the differential amplifier of FIG. 7, in accordance with one embodiment of the present invention.

FIG. 8 is a combined block/transistor schematic diagram of op amp 300. As seen from FIG. 8, op amp 300 includes an input stage 400, and an output stage 100. Output stage 100 of op amp 300 is similar to that shown in FIG. 2, and thus is not described hereinbelow. Input stage 400 is shown as including four signal-receiving stages 410, 420, 430 and 440 to receive four primary input signals. It is understood that in other embodiments input stage 400 may include more signal-receiving stages, such as six or eight.

Figure 9:
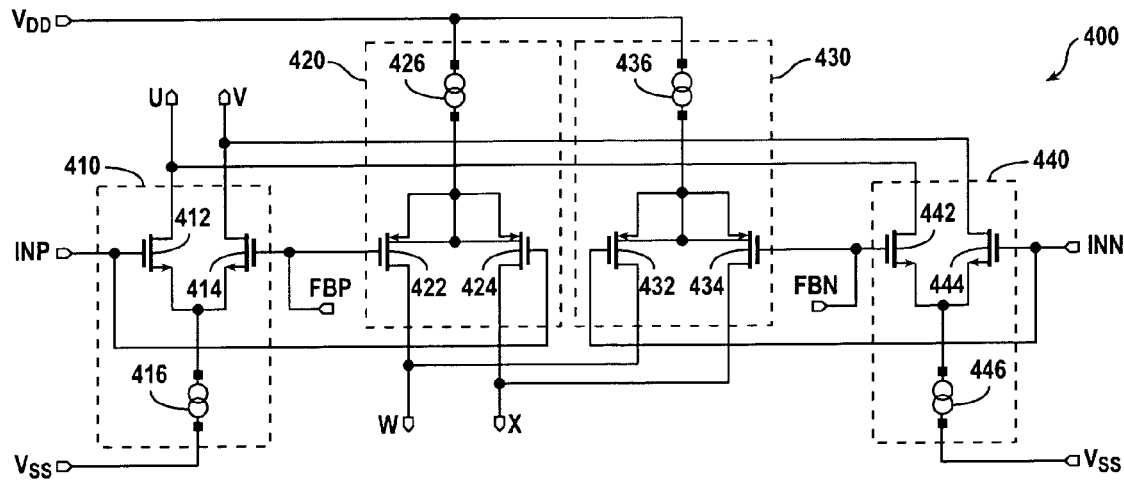
FIG. 9 is a schematic diagram of the transistors forming the signal-receiving stages of the input stage of the differential amplifier of FIG. 7, in accordance with one embodiment of the present invention.

FIG. 9 is a transistor schematic diagram of input stage 400. As seen from FIGS. 8–9, signal-receiving stage 410 includes NMOS transistors 412 and 414—that together form a first source-coupled pair amplifier—and current sink 416. Signal-receiving stage 420 includes PMOS transistors 422 and 424—that together form a second source-coupled pair amplifier—and current source 426. Signal-receiving stage 430 includes PMOS transistors 432 and 434—that together form a third source-coupled pair amplifier—and current source 436. Signal-receiving stage 440 includes NMOS transistors 442 and 444—that together form a fourth source-coupled pair amplifier—and current sink 446. Input stage 400 has a rail-to-rail input range feature. Input stage 400 may be simplified by deleting either the NMOS source-coupled pairs or PMOS source-coupled pairs if a rail-to-rail input range is not required.

Signal INP is applied to the gate terminals of transistors 412 and 424. Signal INN is applied to the gate terminals of transistors 432 and 444. Signal FBP is applied to the gate terminals of transistors 414 and 422. Signal FBN is applied to the gate terminals of transistors 434 and 442. The source terminals of transistors 412 and 414 are coupled to a first terminal of current sink 416 whose second terminal is coupled to supply voltage Vss. The source terminals of transistors 422 and 424 are coupled to a first terminal of current source 426 whose second terminal is coupled to supply voltage Vdd. The source terminals of transistors 432 and 434 are coupled a first terminal of current source 436 whose second terminal is coupled to supply voltage Vdd. The source terminals of transistors 442 and 444 are coupled to a first terminal of current sink 446 whose second terminal is coupled to supply voltage Vss.

The drain terminals of transistors 412 and 442 are coupled to one another and carry signal U that is delivered to output stage 100. The drain terminals of transistors 414 and 444 are coupled to one another and carry signal V that is delivered to output stage 100. The drain terminals of transistors 422 and 432 are coupled to one another and carry signal W that is delivered to output stage 100. The drain terminals of transistors 424 and 434 are coupled to one another and carry signal X that is delivered to output stage 100.

Figure 2:
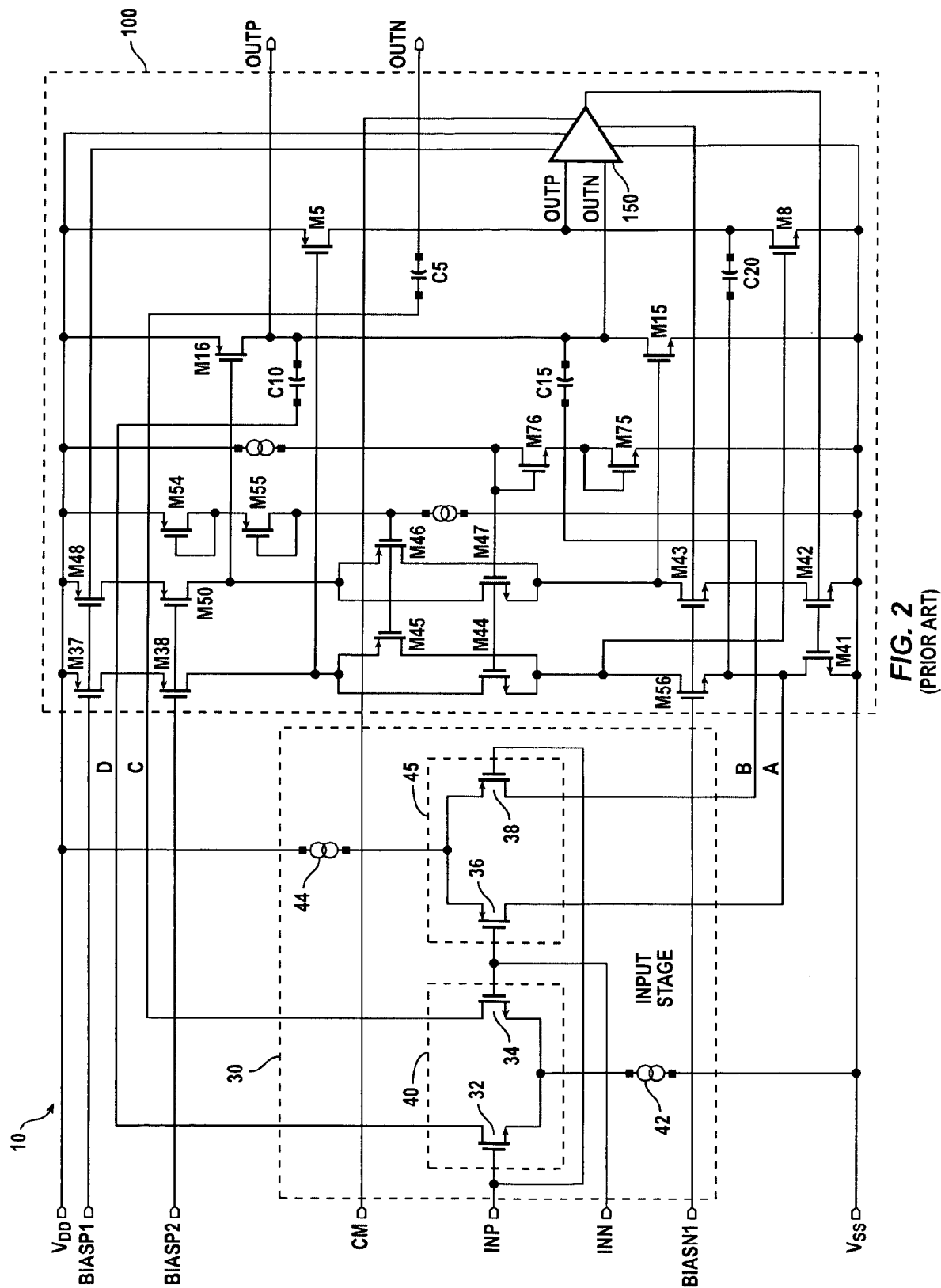
FIG. 2 is a transistor/block diagram of various stages of the differential amplifier of FIG. 1, as known in the prior art.
Figure 4:
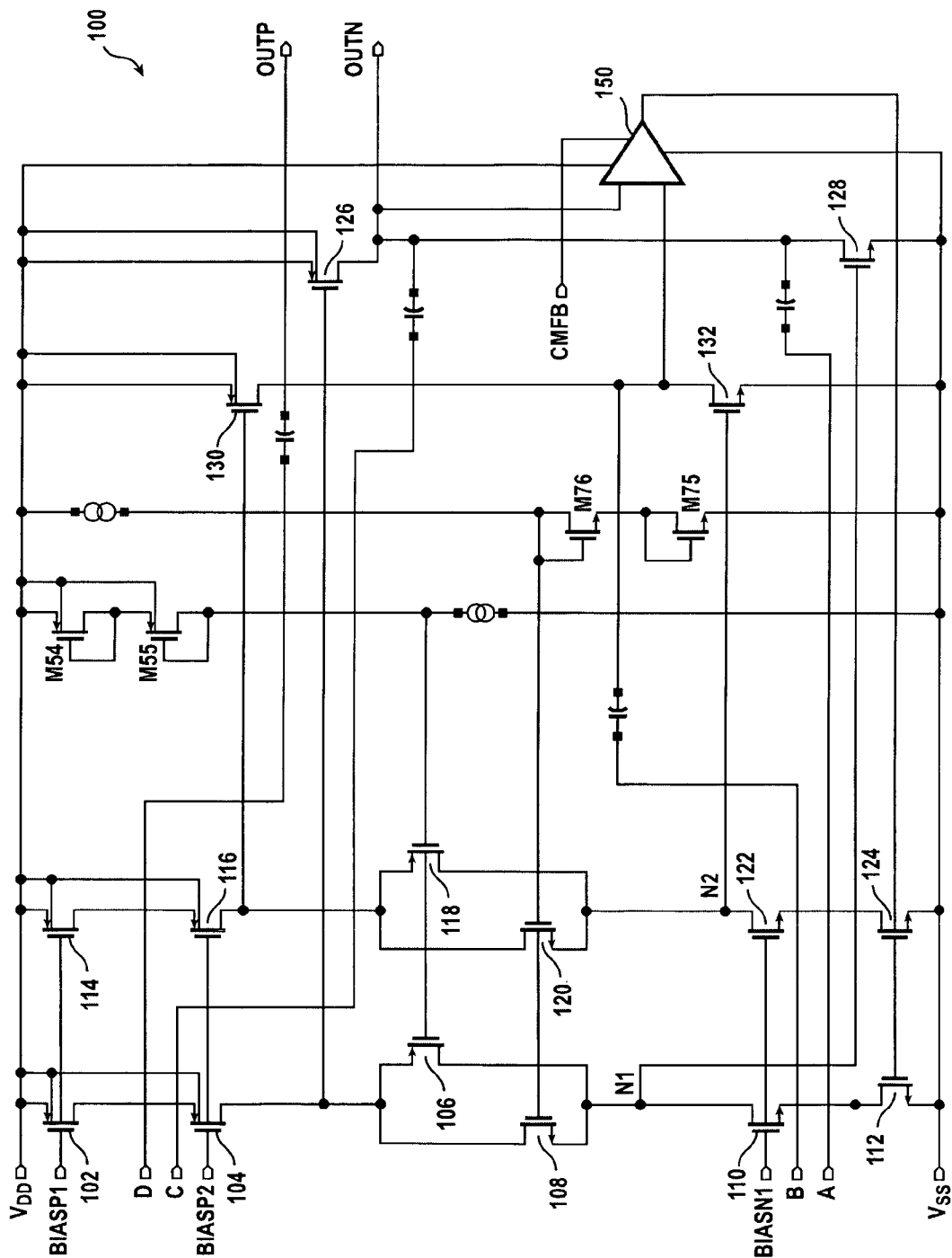
FIG. 4 is a schematic diagram of the output stage of the differential amplifier of FIG. 1, as known in the prior art.
Figure 5:
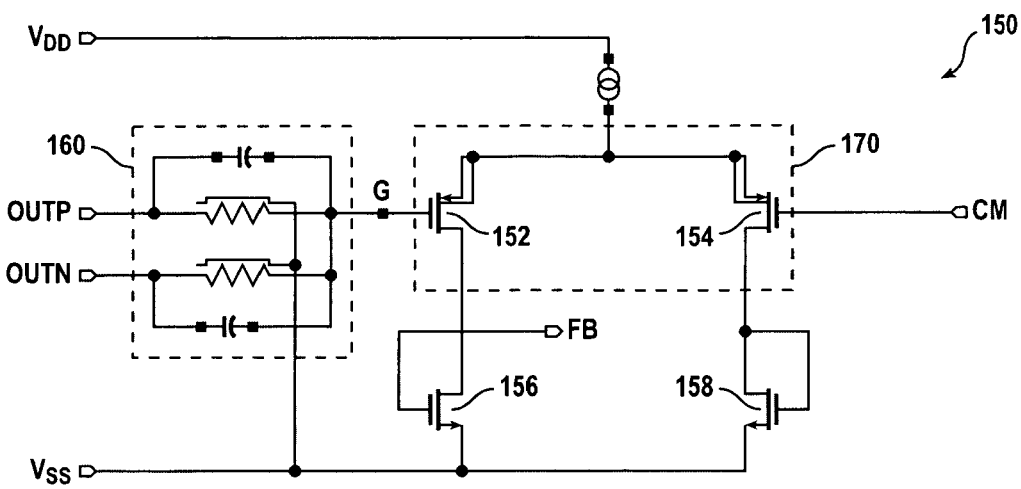
FIG. 5 is a transistor schematic diagram of common-mode feedback circuit disposed in the output stage of the differential amplifier of FIG. 1, as known in the prior art.
Figure 6:
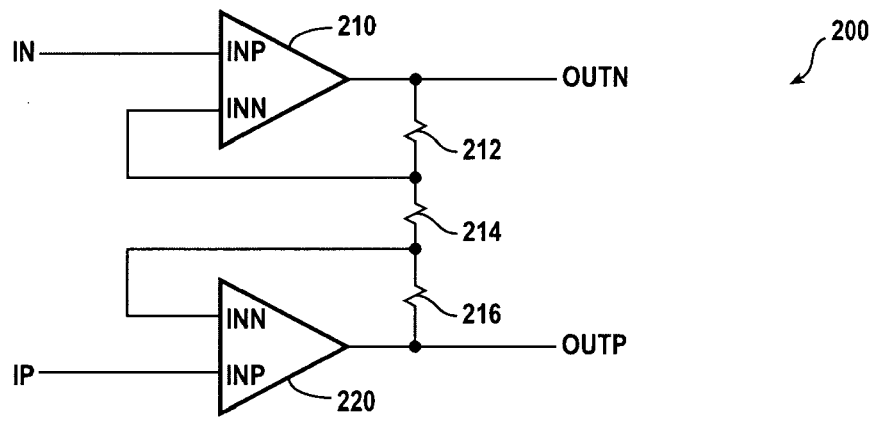
FIG. 6 is a schematic block diagram of a non-inverting differential amplifier, as known in the prior art.

To achieve substantially the same gain and bandwidth as the amplifier 10 shown in FIG. 2, op amp 300 is adapted such that the current flow through each of current sinks 416, 446 is substantially half of that flowing through current sink 42 of op amp 10. Similarly, the current flow through each of current sources 426 and 436 is substantially half of that flowing through current source 44 of op amp 10. In operation, two of the signals applied to input stage 400 of op amp 300 are derived from output signals OUTP, and OUTN and are used as feed-back signals. This enables op amp 300 to operate in a non-inverting mode, as described further below. The capacitive load of the input terminals of op amp 300 to which signals INP and INN are applied, is one-half that of the corresponding input terminals of op amp 10.

Figure 1:
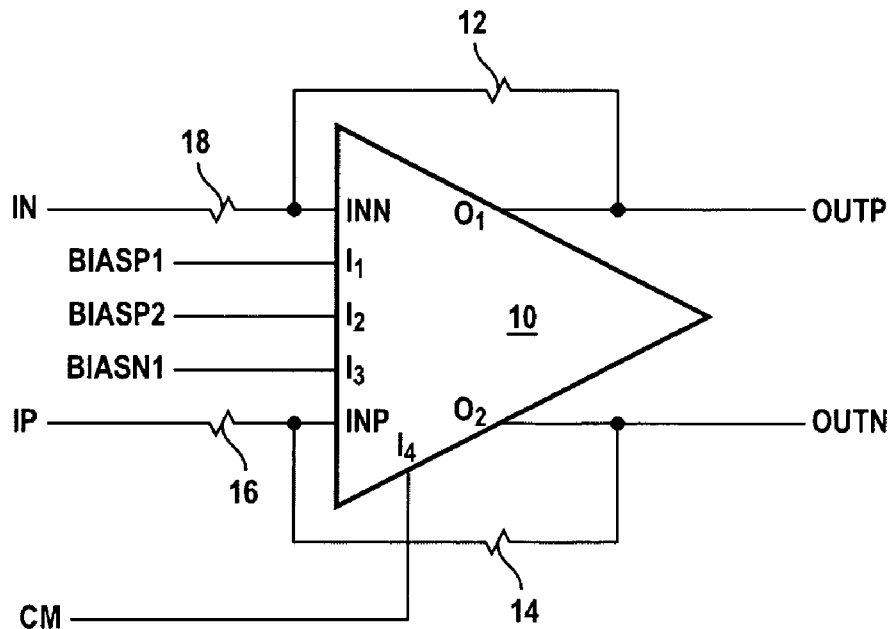
FIG. 1 is a schematic block diagram of an inverting differential amplifier, as known in the prior art.
Figure 3:
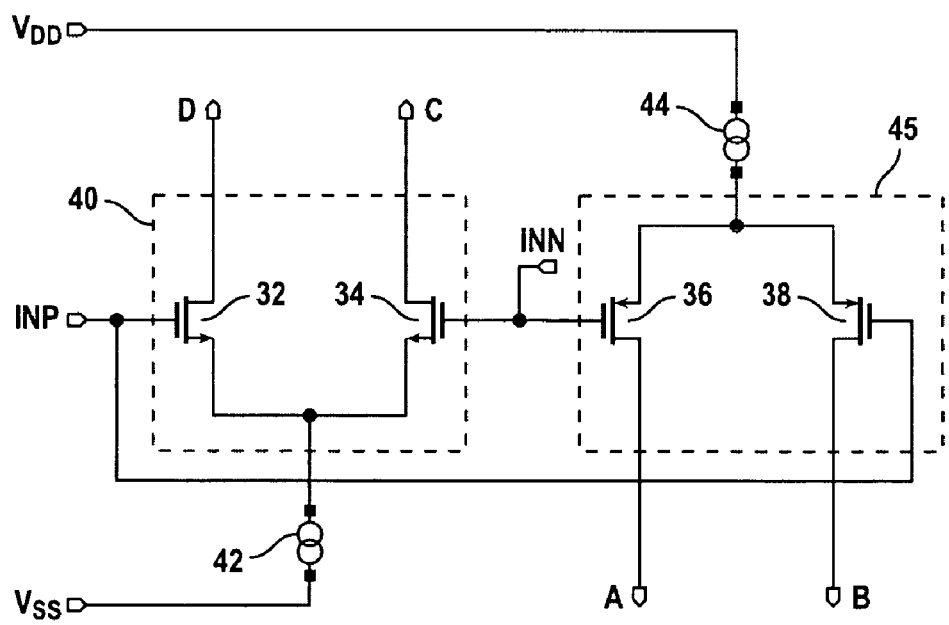
FIG. 3 is a schematic diagram of the input stage of the differential amplifier of FIG. 1, as known in the prior art.

Each pair of associated transistors in FIG. 9 correspond to a single transistor in FIG. 3. For example, transistors 412 and 442 of FIG. 9 correspond to transistor 32 of FIG. 3. Similarly, transistors 414 and 444 of FIG. 9 correspond to transistor 34 of FIG. 3. In other words, each transistor in FIG. 3 is split into two transistors in FIG. 9. Similarly, each current in FIG. 3 is split into two current source in FIG. 9. Therefore, the input stage shown in FIG. 9 has the same gain and bandwidth as the input stage shown in FIG. 3.

Figure 10:
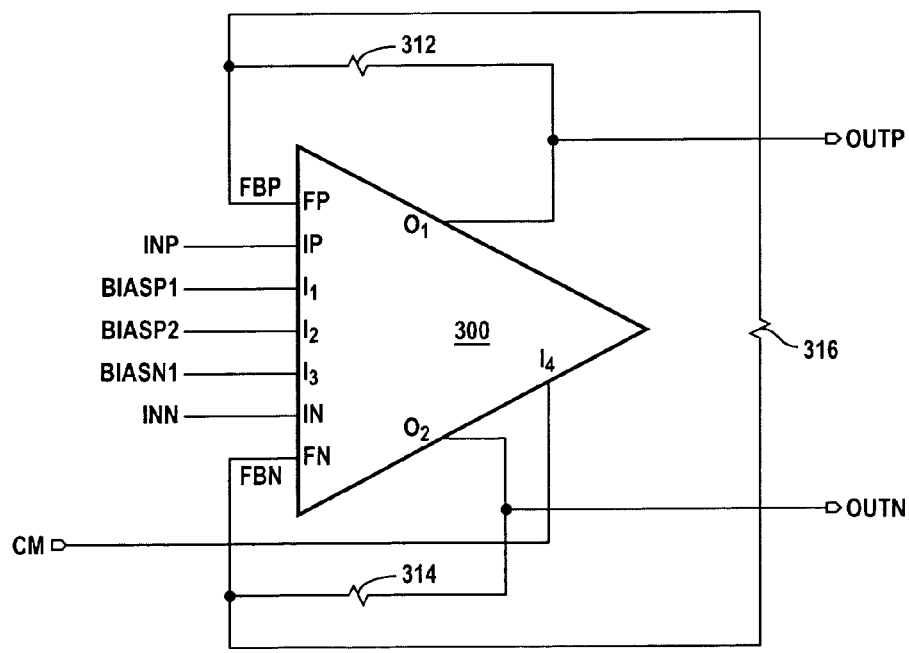
FIG. 10 is a simplified block diagram of the differential amplifier of FIG. 7 configured to amplify differential signals in a non-inverting mode, in accordance with one embodiment.

FIG. 10 shows the resistors disposed between various input/output terminals of op amp 300 to achieve non-inverting signal amplification, in accordance with one embodiment of the present invention. In accordance with this embodiment, resistor 312 is coupled between the output terminal carrying signal OUTP and the input terminal receiving signal FBP. Therefore, signal OUTP is fed back to op-amp 300 via resistor 312 using one of the op amp 300's input terminals. Similarly, resistor 314 is coupled between the output terminal carrying signal OUTN and the input terminal receiving signal FBN. Therefore, signal OUTN is fed back to op amp 300 via resistor 314 using another one of the op amp 300's input terminals. Resistor 316 is disposed between the input terminals to which signals FBP and FBN are applied. The operation of op amp 300 shown in FIG. 10 is described below.

If voltage signal INP is changed so as to be greater than voltage signal INN, voltage signal FBP is changed to be less than signal INP and signal FBN is changed to be higher than signal INN because of the delay of the feedback action. Accordingly, transistors 412, 422, 442, and 432 conduct more current whereas transistors 414, 424, 434 and 444 conduct less current. The change in the currents flowing through these transistors causes the current flow through transistors 116, 110, as well as transistors 126, 132 to decrease, and the current flow through transistors 104, 122, 130, and 128 to increase. Accordingly, output voltage signal OUTP increases and output voltage signal OUTN decreases until they both reach new equilibrium values because of the feedback signals FBP and FBN that are fed back to input side 100.

Alternatively, if voltage signal INP is changed so as to be smaller than voltage signal INN, voltage signal FBP is changed to be greater than signal INP and signal FBN is changed to be lower than signal INN because of the delay of the feedback action. Accordingly, transistors 412, 422, 442, and 432 conduct less current whereas transistors 414, 424, 434 and 444 conduct more current. The change in the currents flowing through these transistors causes the current flow through transistors 116, 110, as well as transistors 126, 132 to increase, and the current flow through transistors 104, 122, 130, and 128 to decrease. Accordingly, output voltage signal OUTP decrease and output voltage signal OUTN increase until they both reach new equilibrium values because of the feedback signals FBP and FBN that are fed back to input side 100.

Figure 11:
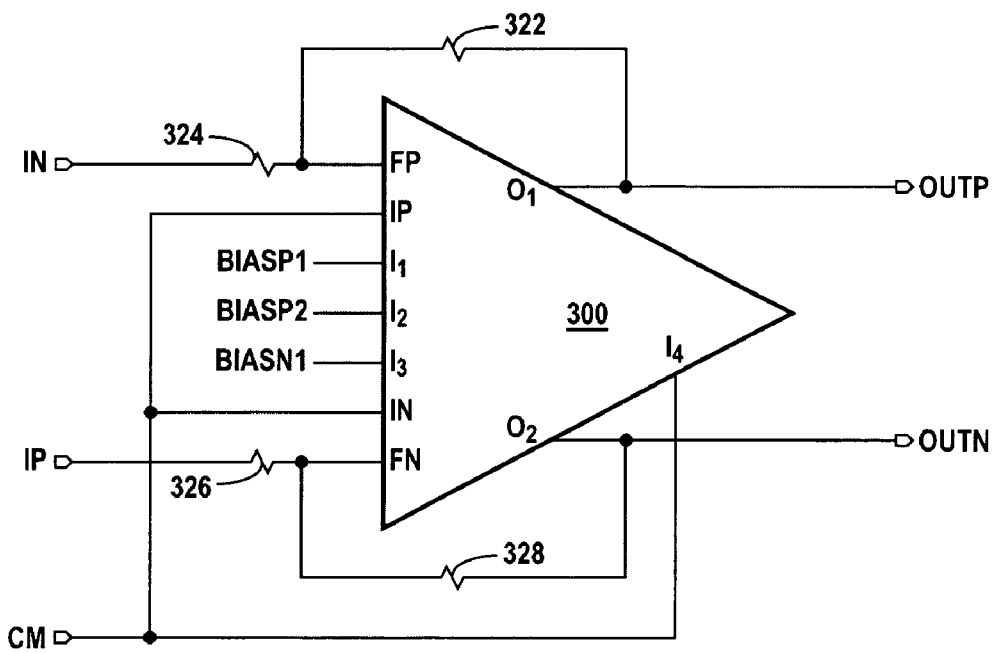
FIG. 11 is a simplified block diagram of the differential amplifier of FIG. 7 configured to amplify differential signals in an inverting mode, in accordance with another embodiment.

FIG. 11 shows resistors disposed between various input/output terminals of op amp 300 to achieve inverting signal amplification, in accordance with another embodiment of the present invention. In accordance with this embodiment, resistor 322 is coupled between the output terminal carrying signal OUTP and input terminal FP. Therefore, signal OUTP is fed back to op amp 300 via resistor 322 using one of the op amp 300's input terminals. Similarly, resistor 328 is coupled between the output terminal carrying signal OUTN and input terminal FN. Therefore, signal OUTN is fed back to op amp 300 via resistor 324 using another one of the op amp 300's input terminals. Input signals IN and IP are applied to input terminals FP, and FN via resistors 324 and 326 respectively. Signals BIASP1, BIASP2 and BIASN1 are used to bias various transistors disposed in the output stage of op amp 300. Signal CM is applied to the remaining three input terminals of op amp 300. The operation of this embodiment is understood in view of the description of the embodiment shown in FIG. 10 and is thus not described further.

Figure 12:
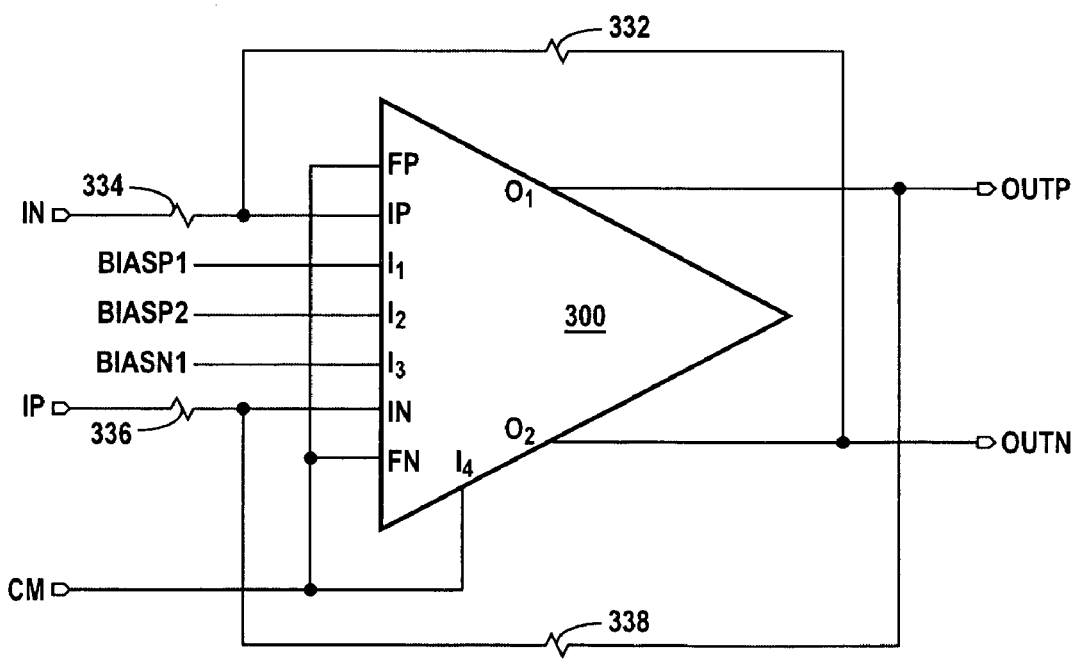
FIG. 12 is a simplified block diagram of the differential amplifier configured to amplify differential signals in an inverting mode, in accordance with yet another embodiment.

FIG. 12 shows resistors disposed between various input/output terminals of op amp 300 to achieve inverting signal amplification, in accordance with another embodiment of the present invention. In accordance with this embodiment, resistor 332 is coupled between the output terminal carrying signal OUTN and the input terminal receiving signal IN. Therefore, signal OUTP is fed back to op amp 300 via resistor 332 using one of the op amp 300's input terminals. Similarly, resistor 338 is coupled between the output terminal carrying signal OUTP and the input terminal receiving signal IP. Therefore, signal OUTN is fed back to op amp 300 via resistor 338 using another one of the op amp 300's input terminals. Input signals IN and IP are applied to the two shown input terminals via resistors 334 and 336 respectively. Signals BIASP1, BIASP2 and BIASN1 are used to bias various transistors disposed in the output stage of op amp 300. Signal CM is applied to the remaining three input terminals of op amp 300. The operation of this embodiment is understood in view of the description of the embodiment shown in FIG. 10 and is thus not described further.

The above embodiments of the present invention are illustrative and not limitative. The invention is not limited by the type of current source or current sink used in the differential amplifier of the present invention. The invention is not limited by the type of integrated circuit in which the differential amplifier of the present invention may be disposed. Nor is the invention limited to any specific type of process technology, e.g., CMOS, Bipolar, or BICMOS, or otherwise that may be used to manufacture the low-voltage differential signal driver of present invention. Other additions, subtractions, deletions, and modifications may be made without departing from the scope of the present disclosure as set forth in the appended claims.

What is claimed is:

1. An operational amplifier comprising:
    an output stage having a pair of output terminals adapted to carry a pair of differential output signals; and
    an input stage coupled to the output stage, said input stage further comprising at least four signal-receiving stages having at least four input terminals adapted to receive at least four input signals, wherein in response to the at least four input signals, at least one transistor in each of the at least four signal-receiving stages conducts more current and at least another one transistor in each of the at least four signal-receiving stages conducts less current, wherein the at least four signal-receiving stages generate at least four intermediate signals that are delivered to the output stage, wherein at least two of the input signals are feedback signals that are derived from the pair of differential output signals.

2. The operational amplifier of claim 1 wherein each of the at least four signal-receiving stages includes a source-coupled pair amplifier coupled to either a current source or a current sink.

3. The operational amplifier of claim 2 wherein two of the source-coupled pair amplifiers include NMOS transistors, and two of the source-coupled pair amplifiers include PMOS transistors.

4. The operational amplifier of claim 3 wherein each of the at least four input signals is applied to a gate terminal of an NMOS transistor of the source-coupled pair amplifier disposed in one of the at least four signal-receiving stages as well as to a gate terminal of a PMOS transistor of the source-coupled pair amplifier disposed in another one of the at least four signal-receiving stages.

5. The operational amplifier of claim 4 further comprising a fifth input terminal operative to receive a common-mode signal adapted to set a common mode gain of the operational amplifier.

6. The operational amplifier of claim 5 further comprising:
    a first resistor coupled between a first one of the output terminals and the input terminal receiving a first one of the feedback signals;
    a second resistor coupled between a second one of the output terminals and the input terminal receiving a second one of the feedback signals; and
    a third resistor coupled between the first one of the input terminals and the second one of the input terminals.

7. The operational amplifier of claim 5 further comprising:
    a first resistor coupled between a first one of the output terminals and the input terminal receiving a first one of the feedback signals;
    a second resistor coupled between a second one of the output terminals and the input terminal receiving a second one of the feedback signals; and
    a third resistor coupled to the input terminal receiving the first one of the feedback signals; and
    a fourth resistor coupled to the input terminal receiving the second one of the feedback signals.

8. The operational amplifier of claim 5 further comprising:
    a first resistor coupled between a first one of the output terminals and the input terminal receiving a first one of the feedback signals;
    a second resistor coupled between a second one of the output terminals and the input terminal receiving a second one of the feedback signals; and
    a third resistor coupled to the input terminal receiving the first one of the feedback signals;
    a fourth resistor coupled to the input terminal receiving the second one of the feedback signals; and wherein said common-mode signal is also applied to the remaining two input signals that are not feedback signals.

9. A method of amplifying signals comprising:
    receiving four input signals;

modifying a current flowing through at least one of first, second, third and fourth signal-receiving stages in response to changes in at least one of the four input signals to thereby deliver four intermediate signals to an output stage;

generating a pair of differential output signals in response to the delivery of the four intermediate signals, wherein at least two of the input signals are feedback signals that are derived from the pair of differential output signals.

10. The method of claim 9 wherein each of the at least four signal-receiving stages includes a source-coupled pair amplifier coupled to either a current source or a current sink.

11. The method of claim 10 wherein two of the source-coupled pair amplifiers include NMOS transistors, and two of the source-coupled pair amplifiers include PMOS transistors.

12. The method of claim 11 wherein each of the at least four input signals is applied to a gate terminal of an NMOS transistor of the source-coupled pair amplifier disposed in one of the at least four signal-receiving stages as well as to a gate terminal of a PMOS transistor of the source-coupled pair amplifier disposed in another one of the at least four signal-receiving stages.

13. The method of claim 12 further comprising:
receiving a fifth input signal adapted to set a common mode gain of the amplification.

14. The method of claim 13 further comprising:
applying a first one of the feedback signals and a first one of the pair of differential signals to first and second terminals of a first resistor;

applying a second one of the feedback signals and a second one of the pair of differential signals to first and second terminals of a second resistor; and applying the first one and second one of the feedback signals to first and second terminals of a third resistors.

15. The method of claim 13 further comprising:
applying a first one of the feedback signals and a first one of the pair of differential signals to first and second terminals of a first resistor;

applying a second one of the feedback signals and a second one of the pair of differential signals to first and second terminals of a second resistor;

applying the first one of the feedback signals to a third resistor; and applying the second one of the feedback signals to a fourth resistor.

16. The method of claim 15 further comprising:
applying the fifth input signal to the remaining two input signals that are not feedback signals.

* * * * *